(12) United States Patent
Tanaka et al.

(10) Patent No.: US 8,593,059 B2
(45) Date of Patent: Nov. 26, 2013

(54) LIGHTING DEVICE

(75) Inventors: Koichiro Tanaka, Kanagawa (JP);
Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 104 days.

(21) Appl. No.: 13/371,779

(22) Filed: Feb. 13, 2012

(65) Prior Publication Data
US 2012/0206036 A1    Aug. 16, 2012

(30) Foreign Application Priority Data

Feb. 14, 2011 (JP) ................................. 2011-028237

(51) Int. Cl.
*H01J 1/63* (2006.01)

(52) U.S. Cl.
USPC ........................... 313/504; 313/505; 313/506

(58) Field of Classification Search
USPC .................................................. 313/495–512
See application file for complete search history.

(56) References Cited

U.S. PATENT DOCUMENTS

| 5,555,109 | A * | 9/1996 | Zimmerman et al. .......... 349/57 |
| 6,717,359 | B2 | 4/2004 | Kimura |
| 6,849,877 | B2 | 2/2005 | Yamazaki et al. |
| 7,211,828 | B2 | 5/2007 | Yamazaki et al. |
| 7,230,271 | B2 | 6/2007 | Yamazaki et al. |
| 7,271,411 | B2 | 9/2007 | Koyama et al. |
| 7,291,969 | B2 | 11/2007 | Tsutsui |
| 7,420,208 | B2 | 9/2008 | Yamazaki et al. |
| 7,427,223 | B2 | 9/2008 | Kimura |
| 7,646,143 | B2 * | 1/2010 | Kimura ........................ 313/501 |
| 7,728,326 | B2 | 6/2010 | Yamazaki et al. |
| 7,952,101 | B2 | 5/2011 | Yamazaki et al. |
| 7,973,471 | B2 | 7/2011 | Kimura |
| 2007/0228382 | A1 | 10/2007 | Yamazaki et al. |
| 2007/0241673 | A1 * | 10/2007 | Yamada et al. ............... 313/506 |
| 2008/0150420 | A1 | 6/2008 | Tsutsui |
| 2008/0266872 | A1 * | 10/2008 | Chang .......................... 362/309 |
| 2010/0163859 | A1 | 7/2010 | Yamazaki et al. |
| 2011/0233557 | A1 | 9/2011 | Yamazaki et al. |
| 2011/0266946 | A1 | 11/2011 | Kimura |

FOREIGN PATENT DOCUMENTS

JP    2009-130132    6/2009

* cited by examiner

*Primary Examiner* — Anh T. Mai
*Assistant Examiner* — Elmito Breval
(74) *Attorney, Agent, or Firm* — Husch Blackwell LLP

(57) ABSTRACT

The lighting device includes a layer containing a light-emitting organic compound which is provided over a substrate; a first barrier layer covering the layer containing a light-emitting organic compound; a second barrier layer provided over the first barrier layer; a sealant provided between the first barrier layer and the second barrier layer; a resin layer including a desiccant which is surrounded by the first barrier layer, the second barrier layer, and the sealant; and a resin substrate which is provided over the second barrier layer and has a first uneven structure on a surface in contact with the second barrier layer and a second uneven structure on a surface in contact with the air, and the second uneven structure has a larger height difference than the first uneven structure.

20 Claims, 7 Drawing Sheets

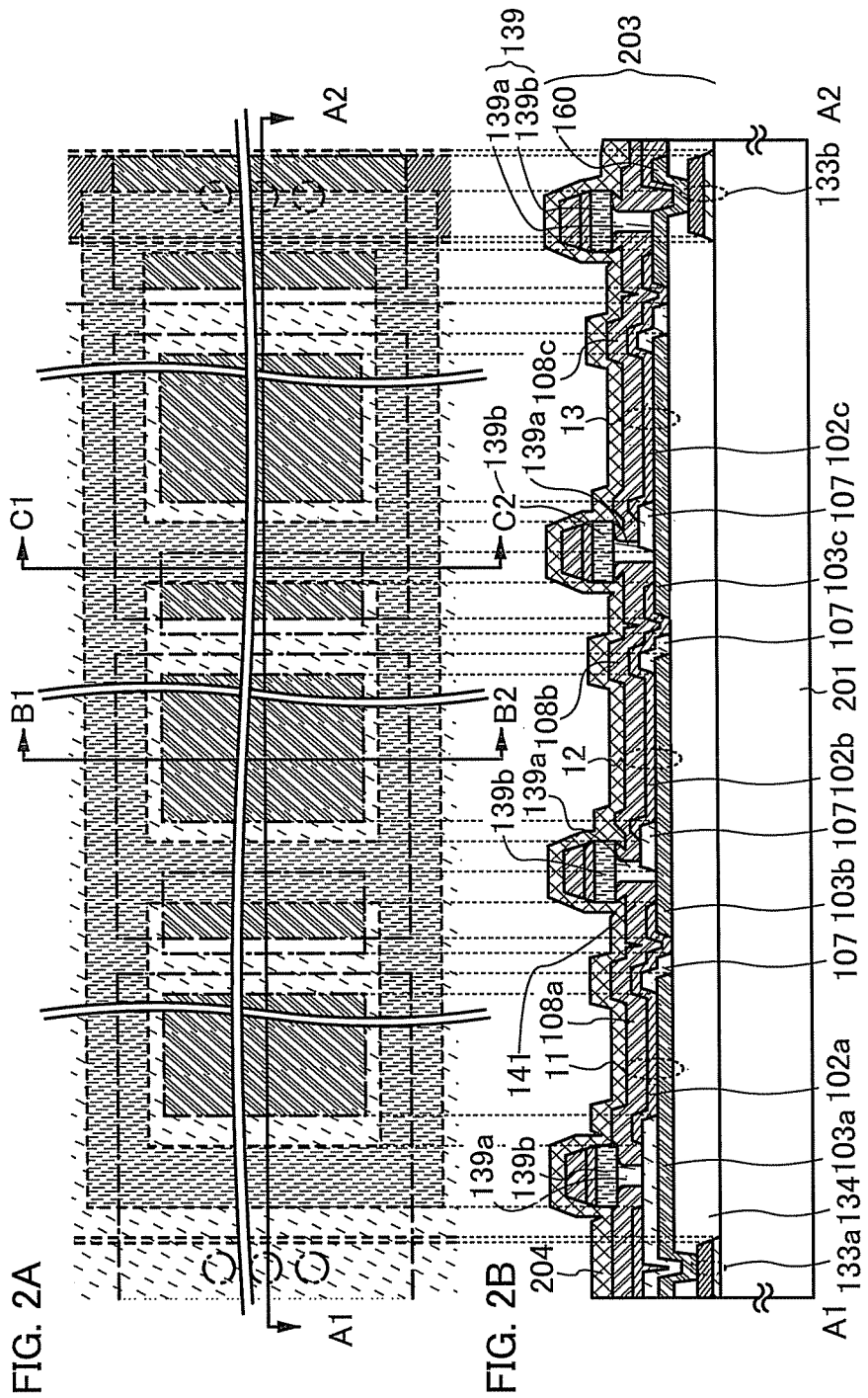

LIGHTING DEVICE

BACKGROUND OF THE INVENTION

1. Field of the Invention

One embodiment of the disclosed invention relates to a lighting device using organic electroluminescence (EL).

2. Description of the Related Art

An organic EL element has been actively researched and developed. In the fundamental structure of the organic EL element, a layer containing a light-emitting organic compound is interposed between a pair of electrodes. By applying voltage to this element, light emission from the light-emitting organic compound can be obtained.

The organic EL element can be formed into a film; thus, a large-area element can be easily formed. Therefore, the organic EL element has a high utility value as a surface light source that can be applied to lighting or the like.

For example, a lighting device including an organic EL element is disclosed in Patent Document 1.

REFERENCE

Patent Document

[Patent Document 1] Japanese Published Patent Application No. 2009-130132

SUMMARY OF THE INVENTION

In order to extract light generated in the layer containing a light-emitting organic compound (hereinafter referred to as "an organic EL layer") to the outside, it is necessary to suppress total reflection of light at an interface between the lighting device and the air.

In order to suppress total reflection of light at the interface between the lighting device and the air, an uneven structure may be provided at the interface between the lighting device and the air. When the uneven structure is provided at the interface between the lighting device and the air, a reflection angle of light is changed; therefore, more light can be extracted to the outside (to the air).

In order to provide the uneven structure at the interface between the lighting device and the air, for example, a resin substrate having a microlens array may be provided on an outermost surface of the lighting device (a surface of the lighting device which is in contact with the air).

However, such a resin substrate does not have a sufficient function of preventing entry of moisture or gas (e.g. oxygen) from the outside.

When moisture or gas enters the organic EL layer from the outside, the organic EL layer may deteriorate due to the moisture and the gas.

When the organic EL layer deteriorates due to moisture or gas, reliability of the lighting device including the organic EL layer may be degraded.

Accordingly, it is an object of one embodiment of the disclosed invention to suppress deterioration of an organic EL layer by preventing entry of moisture or gas into the organic EL layer.

Further, it is another object of one embodiment of the disclosed invention to improve reliability of a lighting device including an organic EL layer by suppressing deterioration of the organic EL layer.

One embodiment of the disclosed invention is a lighting device including a layer containing a light-emitting organic compound which is provided over a substrate; a first barrier layer covering the layer containing a light-emitting organic compound; a second barrier layer provided over the first barrier layer; a sealant provided between the first barrier layer and the second barrier layer; a resin layer including a desiccant which is surrounded by the first barrier layer, the second barrier layer, and the sealant; and a resin substrate which is provided over the second barrier layer and has a first uneven structure on a surface in contact with the second barrier layer and a second uneven structure on a surface in contact with the air, wherein the second uneven structure has a larger height difference than the first uneven structure.

Light generated in the layer containing a light-emitting organic compound (the organic EL layer) passes through the first barrier layer, the resin layer including a desiccant, the second barrier layer, and the resin substrate to be extracted to the outside (to the air).

The first barrier layer, the resin layer including a desiccant, and the second barrier layer are formed to have substantially the same refractive index. Each of the layers is formed in this manner, whereby light passes through the first barrier layer, the resin layer including a desiccant, and the second barrier layer at a relatively high rate. Although there is a difference in the refractive index between the second barrier layer and the resin substrate, the first uneven structure, which is provided at the interface between the second barrier layer and the resin substrate, suppresses total reflection of light, so that more light can be extracted to the resin substrate.

Further, although there is also a difference in the refractive index between the resin substrate and the air, the second uneven structure, which is provided at the interface between the resin substrate and the air, suppresses total reflection of light, so that more light can be extracted to the air.

Since the resin substrate does not have a sufficient function of suppressing entry of moisture, it is difficult to prevent moisture from entering the resin substrate from the outside. However, the second barrier layer, the resin layer including a desiccant, and the first barrier layer are provided between the resin substrate and the organic EL layer.

The second barrier layer and the first barrier layer are formed using a material capable of preventing entry of moisture from the outside. Further, by a function of the desiccant included in the resin layer, moisture can be trapped in the resin layer. Accordingly, even if moisture enters from the resin substrate side, the moisture does not reach the organic EL layer, so that deterioration of the organic EL layer can be prevented.

Although the first barrier layer can prevent moisture from entering the organic EL layer, moisture is likely to enter from the resin substrate having a large area; therefore, by provision of the second barrier layer, a barrier property against moisture can be further improved.

In one embodiment of the disclosed invention, each of the first barrier layer and the second barrier layer is formed using an aluminum oxide film, a silicon nitride film, or a silicon oxynitride film.

In one embodiment of the disclosed invention, the height difference of the first uneven structure is greater than or equal to 0.5 µm and less than or equal to 50 µm, and the height difference of the second uneven structure is greater than or equal to 100 µm and less than or equal to 5 mm.

In one embodiment of the disclosed invention, each of the first uneven structure and the second uneven structure is formed in a stripe shape or in a matrix shape.

In one embodiment of the disclosed invention, a cross-sectional shape of each of the first uneven structure and the second uneven structure is a hemisphere shape or a shape with a vertex.

In one embodiment of the disclosed invention, the substrate is a stainless steel substrate, a tungsten substrate, a nickel substrate, an aluminum substrate, a glass substrate, or a ceramic substrate, and a base film is formed between the substrate and the layer containing a light-emitting organic compound.

In one embodiment of the disclosed invention, the base film is an aluminum oxide film, a silicon nitride film, or a silicon oxynitride film.

According to one embodiment of the disclosed invention, entry of moisture or gas into the organic EL layer can be prevented, so that deterioration of the organic EL layer can be suppressed.

Further, according to one embodiment of the disclosed invention, deterioration of the organic EL layer is suppressed, so that reliability of a lighting device including the organic EL layer can be improved.

BRIEF DESCRIPTION OF THE DRAWINGS

In the accompanying drawings:

FIGS. 2A and 2B are a top view of a lighting device and a cross-sectional view thereof, respectively;

DETAILED DESCRIPTION OF THE INVENTION

Figure 1:
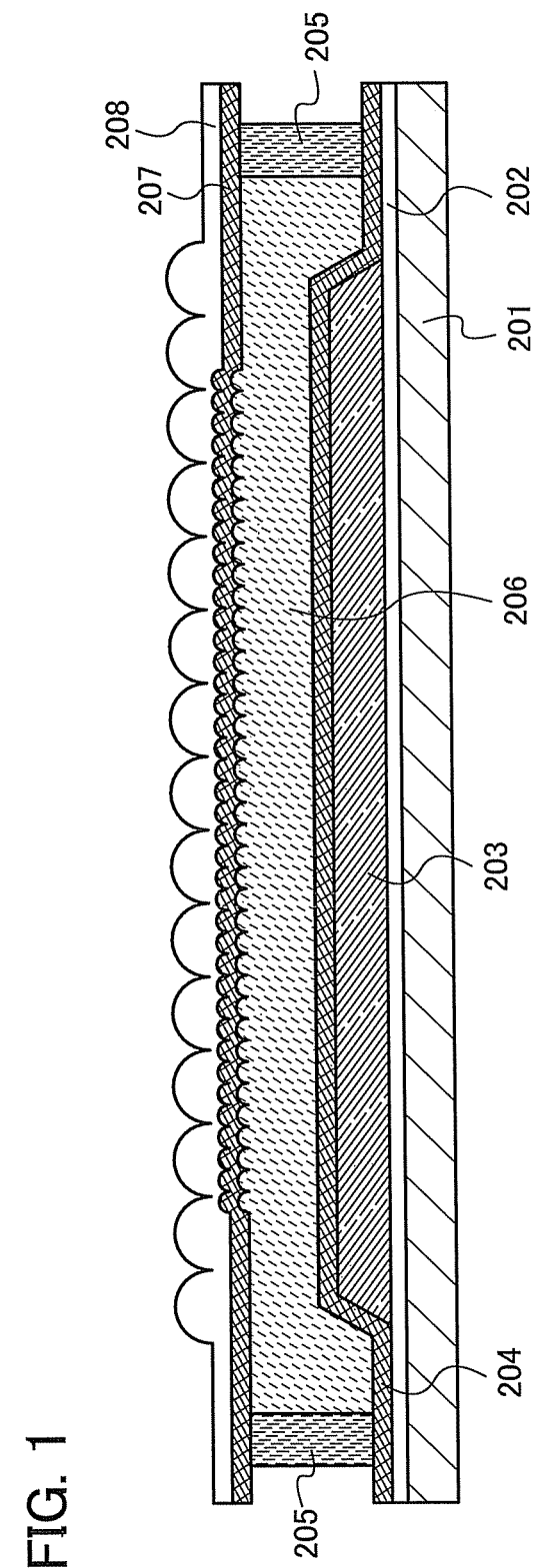
FIG. 1 is a cross-sectional view illustrating a lighting device.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof will be omitted.

Embodiment 1

<Structure of Lighting Device>

FIG. 1 is a cross-sectional view illustrating a lighting device of this embodiment. The lighting device illustrated in FIG. 1 includes a substrate 201, a base film 202, a first barrier layer 204 provided over the base film 202, and a light-emitting element layer 203 including an organic EL layer in a region surrounded by the base film 202 and the first barrier layer 204.

A second barrier layer 207 is provided over the first barrier layer 204. Further, a sealant 205 is provided between the first barrier layer 204 and the second barrier layer 207. The sealant 205 is formed over the first barrier layer 204 in a region where the light-emitting element layer 203 is not formed, and seals a resin layer 206 described later.

The resin layer 206 including a desiccant is provided in a region surrounded by the first barrier layer 204, the second barrier layer 207, and the sealant 205.

A resin substrate 208 which has a first uneven structure on a surface in contact with the second barrier layer 207 and a second uneven structure on a surface in contact with the air is provided over the second barrier layer 207.

A third uneven structure is formed on a surface of the second barrier layer 207 which is in contact with the resin substrate 208 so that the first uneven structure provided for the resin substrate 208 is reflected. Reflecting the first uneven structure, the third uneven structure has the same height difference as the first uneven structure. Further, in some cases, a fourth uneven structure is formed on a surface where the second barrier layer 207 and the resin layer 206 are in contact with each other based on a thickness of the second barrier layer 207 so that the third uneven structure is reflected. In the case where the thickness of the second barrier layer 207 is small, the fourth uneven structure has the same height difference as the first uneven structure like the third uneven structure in some cases.

Further, the second barrier layer 207 and the resin layer 206 are formed so that they have substantially the same refractive index. Therefore, in the case where the fourth uneven structure is formed on the surface where the second barrier layer 207 and the resin layer 206 are in contact with each other, much of light generated in the light-emitting element layer 203 is not reflected by the fourth uneven structure, and passes through the resin layer 206 and the second barrier layer 207.

Note that the lighting device in this embodiment is a so-called top-emission lighting device in which light from the light-emitting element layer 203 is extracted to a side opposite to the substrate 201.

As the substrate 201, a substrate having a barrier property against moisture, such as a metal substrate of stainless steel, tungsten (W), nickel (Ni), aluminum (Al), or the like, a glass substrate, or a ceramic substrate is used. The use of a substrate having a barrier property against moisture as the substrate 201 can prevent moisture from entering the light-emitting element layer 203 from the substrate 201 side. Since the lighting device in this embodiment is a top-emission lighting device as described above, a substrate having a light-shielding property can be used as the substrate 201. In this embodiment, a stainless steel substrate is used as the substrate 201.

As the base film 202, an inorganic insulating film can be formed by a sputtering method, for example. For example, as the base film 202, an aluminum oxide film, a silicon nitride film, a silicon oxynitride film, or the like may be formed. The use of the above-described material as the base film 202 is preferable since entry of moisture from the outside can be prevented. Note that, in this specification, silicon oxynitride refers to a substance in which the relative proportion of oxygen is higher than that of nitrogen. The base film 202 may be fainted as necessary, and whether the base film 202 is formed or not may be determined based on a material of the substrate 201.

A detailed structure of the light-emitting element layer 203 and a material of the organic EL layer included in the light-emitting element layer 203 will be described later. The light generated in the light-emitting element layer 203 passes through the first barrier layer 204, the resin layer 206, the second barrier layer 207, and the resin substrate 208 to be extracted to the outside.

The first barrier layer 204 covering the light-emitting element layer 203 is formed to a thickness of greater than or equal to 5 nm and less than or equal to 500 nm, preferably to a thickness of 100 nm using an aluminum oxide film, a silicon nitride film, a silicon oxynitride film, or the like which can prevent entry of moisture from the outside. The first barrier layer 204 is formed to have substantially the same refractive index as the light-emitting element layer 203. For example, as the first barrier layer 204, an aluminum oxide film, a silicon nitride film, or a silicon oxynitride film is used. The refractive index of the film is greater than or equal to 1.65 and less than or equal to 2.3, within that range of which the first barrier layer 204 is formed to have substantially the same refractive index as the light-emitting element layer 203. Therefore, the light emitted from the light-emitting element layer 203 passes through the first barrier layer 204 at a relatively high rate.

In the case where a silicon nitride film is used as the first barrier layer 204, a silicon nitride film formed by a surface wave plasma CVD method is preferably used. Surface wave plasma is large-area high-density plasma generated by using a surface wave of an electromagnetic wave which propagates on a surface of a dielectric plate. Since the surface wave plasma is obtained by electrodeless discharge, the substrate can be placed at a position which is sufficiently distanced from a high energy portion of the plasma, so that a condition which causes less plasma damage can be obtained. A silicon nitride film formed by a surface wave plasma CVD method is preferable as the first barrier layer 204 since it has a barrier property as high as a vapor permeability of approximately $10^{-7}$ g/m$^2$·day. Further, the light transmittance of a silicon nitride film formed by a surface wave plasma CVD method is more than 90% (the thickness is 2 µm).

A known material can be used as the sealant 205. For example, a thermosetting material or an ultraviolet curable material may be used. The sealant 205 has a function of preventing moisture from entering an inside of the resin layer 206 from a side surface of the resin layer 206. Thus, deterioration of a function of the desiccant included in the resin layer 206 can be suppressed.

The resin layer 206 includes the desiccant and can be formed using a thermosetting material containing a desiccant or an ultraviolet curable material containing a desiccant. Even if moisture enters from the resin substrate 208 side, the desiccant can prevent the moisture from entering the light-emitting element layer 203.

The resin layer 206 is formed to have substantially the same refractive index as the light-emitting element layer 203 and the first barrier layer 204. For example, the resin layer 206 is formed using a rein having a refractive index of greater than or equal to 1.65 and less than or equal to 2.3 to have substantially the same refractive index as the light-emitting element layer 203 and the first barrier layer 204. Therefore, light emitted from the light-emitting element layer 203 passes through the resin layer 206 at a relatively high rate.

The second barrier layer 207 is formed to a thickness of greater than or equal to 5 nm and less than or equal to 500 nm, preferably to a thickness of 100 nm, using an aluminum oxide film, a silicon nitride film, a silicon oxynitride film, or the like which can prevent entry of moisture from the outside. Further, the use of a silicon nitride film formed by a surface wave plasma CVD method as the second barrier layer 207 is preferable since such a silicon nitride film has a high barrier property as described above.

Further, as described above, the third uneven structure is formed on the surface of the second barrier layer 207 which is in contact with the resin substrate 208 so that the first uneven structure provided for the resin substrate 208 is reflected. Further, in some cases, the fourth uneven structure is formed on the surface where the second barrier layer 207 and the resin layer 206 are in contact with each other based on the thickness of the second barrier layer 207 so that the third uneven structure is reflected. The third uneven structure has the same height difference as the first uneven structure. In the case where the thickness of the second barrier layer 207 is small, the fourth uneven structure has the same height difference as the first uneven structure.

Although the first uneven structure brings about an advantageous effect even in the case where it is in a stripe shape, it is preferably in a matrix shape. There is no particular limitation on the cross-sectional shape of the uneven structure; for example, a hemisphere shape or a shape with a vertex can be employed. As the shape with a vertex, a circular cone or a pyramid (e.g., a triangular pyramid, a square pyramid, a hexagonal pyramid, or the like) can be given. The height difference of the first uneven structure is preferably approximately greater than or equal to 0.5 µm and less than or equal to 50 µm. In particular, the height difference is preferably greater than or equal to 1 µm since influence of interference of light can be suppressed. The first uneven structure is preferably patterned so that it is provided without a gap as much as possible throughout the first uneven structure. For example, the first uneven structure is preferably patterned in a closest-packed manner.

As a method for forming the first uneven structure for the resin substrate 208, for example, an etching method, a sand blasting method, a microblast processing method, a droplet discharge method, a printing method (screen printing or offset printing by which a pattern is formed), a coating method such as a spin coating method, a dipping method, a dispenser method, a nanoimprint method, or the like can be employed as appropriate.

The second barrier layer 207 is formed to have substantially the same refractive index as the light-emitting element layer 203. As described above, as the second barrier layer 207, an aluminum oxide film, a silicon nitride film, or a silicon oxynitride film is used. The refractive index of the film is greater than or equal to 1.65 and less than or equal to 2.3, within that range of which the second barrier layer 207 is formed to have substantially the same refractive index as the light-emitting element layer 203.

However, the refractive index of the resin substrate 208 provided over the second barrier layer 207 is greater than or equal to 1.5 and less than or equal to 1.6, which is lower than that of the second barrier layer 207. In the case where the first uneven structure is not provided for the resin substrate 208, due to a difference between the refractive index of the second barrier layer 207 and the resin substrate 208, total reflection of light emitted from the light-emitting element layer 203 may occur at an interface between the second barrier layer 207 and the resin substrate 208. When the total reflection of light emitted from the light-emitting element layer 203 occurs at the interface between the second barrier layer 207 and the resin substrate 208, much of the light cannot be extracted to the outside, which is not sufficient for the lighting device.

However, since the first uneven structure is provided for the resin substrate 208, total reflection of light at the interface between the second barrier layer 207 and the resin substrate 208 can be suppressed, which leads to an improvement in light extraction efficiency.

Further, the second uneven structure provided at an interface between the resin substrate 208 and the air is effective even if it has a stripe shape; however, an uneven structure in a matrix shape is preferable. There is no particular limitation on a cross-sectional shape of the uneven structure, and for example, a hemisphere shape or a shape with a vertex can be employed. As the shape with a vertex of the cross-sectional shape, a circular cone or a pyramid (e.g., a triangular pyramid, a square pyramid, a hexagonal pyramid or the like) can be given.

The height difference of the second uneven structure is approximately greater than or equal to 100 μm and less than or equal to 5 mm, preferably approximately greater than or equal to 300 μm and less than or equal to 1 mm.

The second uneven structure is preferably patterned so that it is provided without a gap as much as possible throughout the second uneven structure. For example, the second uneven structure is preferably patterned so as to fill a plane. The pattern may be formed on an entire surface or part thereof, which is in contact with the air, of the resin substrate 208. The second uneven structure is preferably formed at least over a region where the light-emitting element layer 203 is formed.

Specifically, for the resin substrate 208, a film provided with a hemispherical lens, a film provided with a microlens array, a film provided with an uneven structure or the like can be used.

The lighting device in this embodiment is manufactured in such a manner that it includes the second uneven structure provided on the surface in contact with the air and the first uneven structure provided for a surface opposite to the surface in contact with the air; and the resin substrate 208 on which the second barrier layer 207 is faulted and the substrate 201 over which the first barrier layer 204 covering the light-emitting element layer 203 is formed are bonded to each other with the resin layer 206 including a desiccant. As described above, the second barrier layer 207 is formed on a surface having the first uneven structure; therefore, the third uneven structure reflecting the first uneven structure is formed on the surface of the second barrier layer 207 which is in contact with the resin substrate 208. Further, as described above, the resin layer 206 including a desiccant also serves as an adhesive. The sealant 205 is provided around the resin layer 206 including a desiccant and has a function of preventing moisture from entering the inside of the resin layer 206 from the side surface of the resin layer 206. Thus, deterioration of a function of a desiccant included in the resin layer 206 can be suppressed.

The refractive index of the resin substrate 208 is greater than or equal to 1.5 and less than or equal to 1.6, which is higher than the refractive index of the air, 1.0. Accordingly, in the case where the second uneven structure is not provided for the resin substrate 208, much of light emitted from the light-emitting element layer 203 cannot be extracted to the air due to total reflection.

In this embodiment, by provision of the second uneven structure on the surface of the resin substrate 208 which is in contact with the air, light which cannot be extracted to the air due to total reflection can be reduced, which leads to an improvement in light extraction efficiency of the lighting device.

Note that since the resin substrate 208 does not have a sufficient function of suppressing entry of moisture, it is difficult to prevent moisture from entering the resin substrate 208 from the outside. However, the second barrier layer 207, the resin layer 206 including a desiccant, and the first barrier layer 204 are provided between the resin substrate 208 and the light-emitting element layer 203.

The second barrier layer 207 and the first barrier layer 204 are formed using a material capable of preventing entry of moisture from the outside. Further, since the resin layer 206 includes a desiccant, moisture can be trapped in the resin layer 206. Accordingly, even if moisture enters from the resin substrate 208 side, the moisture does not reach the light-emitting element layer 203, so that deterioration of the light-emitting element layer 203 can be prevented.

As described above, a substrate having a barrier property against moisture is used as the substrate 201. Therefore, entry of moisture from the substrate 201 side can be also prevented, so that deterioration of the light-emitting element layer 203 can be prevented. Further, in the case of forming the base film 202 using a material capable of preventing entry of moisture from the outside over the substrate 201, a function of suppressing entry of moisture can be further improved.

The light generated in the light-emitting element layer 203 passes through the first barrier layer 204, the resin layer 206, and the second barrier layer 207 which have substantially the same refractive index. Although there is a difference in the refractive index between the second barrier layer 207 and the resin substrate 208, the first uneven structure is provided at the interface between the second barrier layer 207 and the resin substrate 208; therefore, total reflection of light can be suppressed, so that more light can be extracted to the resin substrate 208.

Further, although there is also a difference in the refractive index between the resin substrate 208 and the air, the second uneven structure is provided at the interface between the resin substrate 208 and the air; therefore, total reflection of light can be suppressed, so that more light can be extracted to the air.

Thus, according to this embodiment, entry of moisture or gas into the organic EL layer can be prevented, so that deterioration of the organic EL layer can be suppressed.

Further, according to this embodiment, deterioration of the organic EL layer is suppressed, whereby reliability of the lighting device including the organic EL layer can be improved.

Furthermore, in the lighting device in this embodiment, the light extraction efficiency is improved.

⟨Structure of Light-Emitting Element Layer⟩

Figure 7:
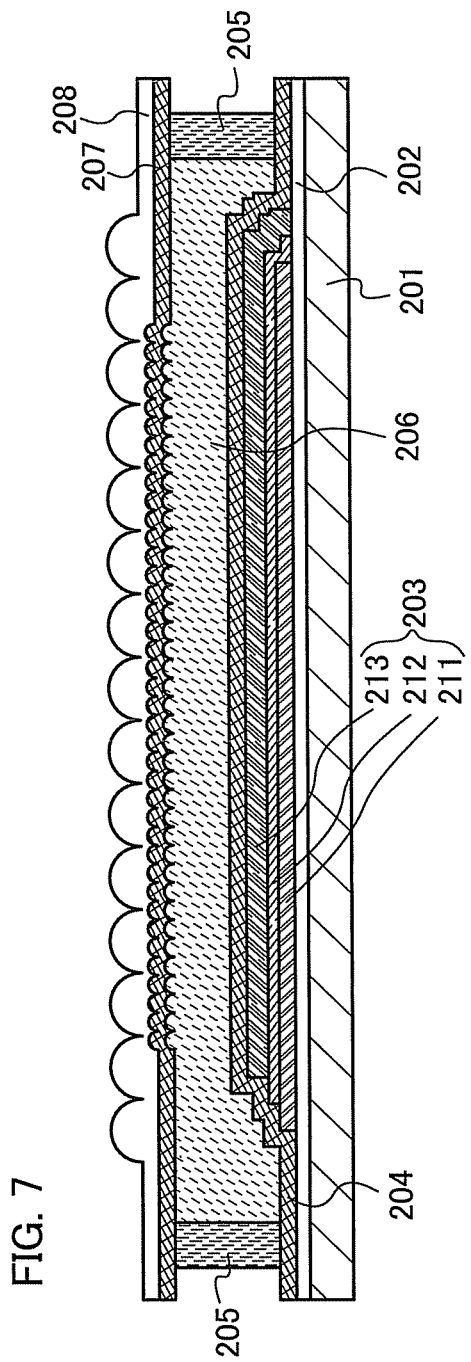
FIG. 7 is a cross-sectional view illustrating the lighting device.

FIG. 7 illustrates a structure of the light-emitting element layer 203 and the lighting device including the light-emitting element layer 203. In the light-emitting element layer 203 illustrated in FIG. 7, a first electrode 211, an organic EL layer 212, and a second electrode 213 are stacked over the substrate 201. Note that in FIG. 7, the base film 202 is formed between the substrate 201 and the first electrode 211; however, whether the base film 202 is formed or not may be determined based on the material of the substrate 201.

As illustrated in FIG. 7, end portions of the first electrode 211, the organic EL layer 212, and the second electrode 213 do not overlap with one another, so that short circuit of the first electrode 211 and the second electrode 213 is suppressed.

The light-emitting element layer 203 illustrated in FIG. 7 is provided over the substrate 201 and covered with the first barrier layer 204. Note that in FIG. 7, the same portions as those in FIG. 1 are denoted by the same reference numerals. Further, materials for the lighting device illustrated in FIG. 7 will be described later.

⟨Another Structure of Light-Emitting Element Layer⟩

Figure 3A:
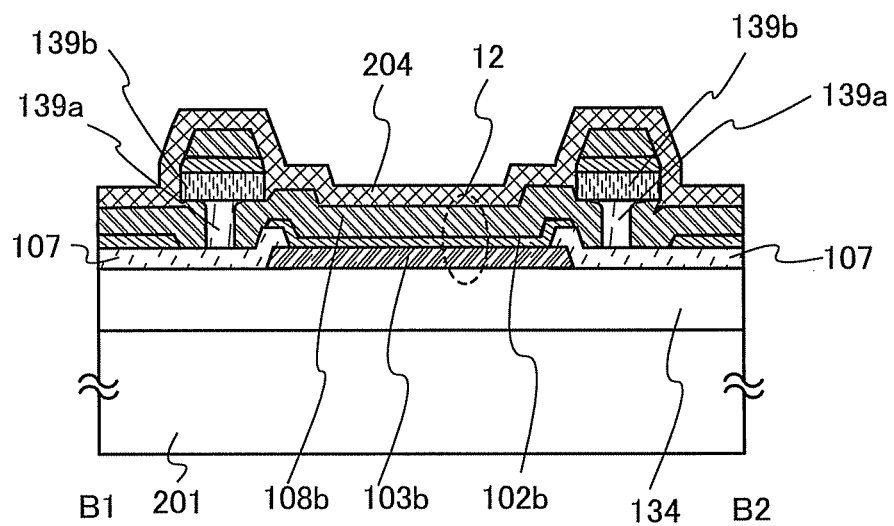
FIGS. 3A and 3B are cross-sectional views illustrating the lighting device.
Figure 3B:
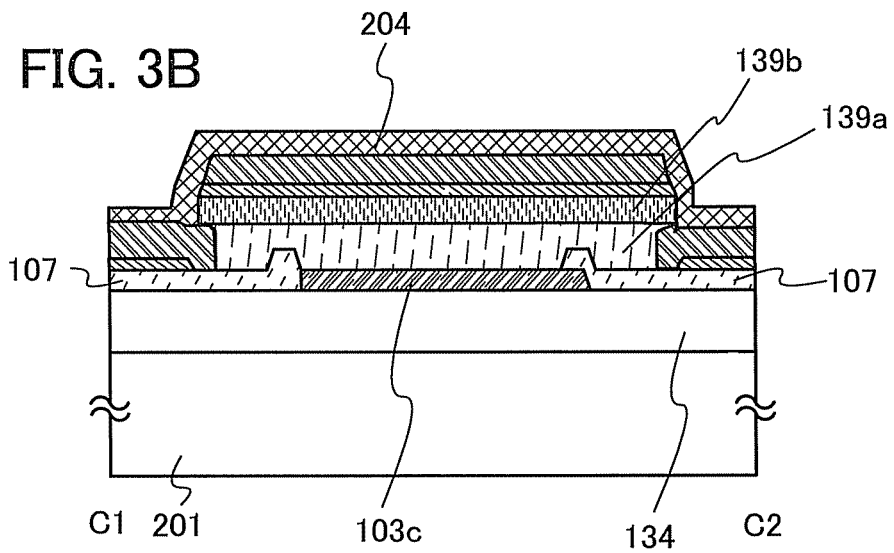

FIGS. 2A and 2B and FIGS. 3A and 3B illustrate another structure of the light-emitting element layer 203. Note that FIG. 2A is a top view of the light-emitting element layer 203, and FIG. 2B and FIGS. 3A and 3B are cross-sectional views taken along line A1-A2, line B1-B2, and line C1-C2 of FIG. 2A, respectively.

The light-emitting element layer 203 illustrated in FIGS. 2A and 2B and FIGS. 3A and 3B is provided over the substrate 201 and covered with the first barrier layer 204.

The light-emitting element layer 203 includes a wiring 133a, a wiring 133b, a planarization layer 134, a partition wall 107, a first light-emitting element 11, a second light-emitting element 12, a third light-emitting element 13, and a separation layer 139 (a leg portion 139a and a stage portion 139b).

The first light-emitting element 11 includes a first electrode 103a formed over the planarization layer 134, an organic EL layer 102a framed over the first electrode 103a, and a second electrode 108a formed over the organic EL layer 102a.

The second light-emitting element 12 includes a first electrode 103b formed over the planarization layer 134, an organic EL layer 102b formed over the first electrode 103b, and a second electrode 108b formed over the organic EL layer 102b.

The third light-emitting element 13 includes a first electrode 103c formed over the planarization layer 134, an organic EL layer 102c formed over the first electrode 103c, and a second electrode 108c formed over the organic EL layer 102c.

The first electrode 103a in the first light-emitting element 11 is connected to the wiring 133a. The second electrode 108c in the third light-emitting element 13 is connected to the wiring 133b through an extraction electrode 160.

In this embodiment, the second electrode 108a intersects with an end portion of the first electrode 103a with the insulating partition wall 107 provided therebetween in a position where the insulating partition wall 107 is provided for the end portion of the first electrode 103a. The second electrode 108a and the first electrode 103b are directly connected to each other. Thus, the first light-emitting element 11 and the second light-emitting element 12 are connected in series.

Note that the partition wall 107 has an end portion with a forward tapered shape. In a forward tapered shape, a layer gradually increases in thickness and is in contact with a layer serving as a base in a cross section. When the partition wall 107 has the forward tapered shape, a film formed over the partition wall 107 can be prevented from being broken.

A region where the second electrode 108a is connected to the first electrode 103b is included in a region where the stage portion 139b of the separation layer 139 protrudes over the first electrode 103b. In the region, the organic EL layer 102a which is formed such that its entry is suppressed is not formed over the first electrode 103b, and only the second electrode 108a which is formed such that its entry is promoted is formed in contact with the first electrode 103b.

Consequently, the light-emitting device with high driving voltage, in which the first light-emitting element 11 and the second light-emitting element 12 are connected in series, can be provided.

The same can be said for the second light-emitting element 12 and the third light-emitting element 13.

The partition wall 107 is provided to cover the end portion of the first electrode 103a in the first light-emitting element 11 illustrated in FIGS. 2A and 2B. Thus, a short circuit between the first electrode 103a and the second electrode 108a at a step portion formed at the end portion of the first electrode 103a can be prevented, whereby the light-emitting element with high reliability can be provided.

Further, the partition wall is provided over the first electrode 103b, whereby a short circuit between the first electrode 103b and the second electrode 108b in a region overlapping with the stage portion 139b can be prevented.

In addition, with a structure capable of being manufactured without using a metal mask, problems caused by damage of a surface of the substrate due to an end of an opening in the metal mask can be prevented; thus, the light-emitting element with high reliability can be provided. Moreover, since a metal mask is not used, there are effects of reducing a manufacturing cost and a maintenance cost such as cleaning.

The separation layer 139 includes a leg portion and a stage portion protruding over the electrode so that a projected area of the stage portion is larger than that of the leg portion. In the structure illustrated in FIG. 2B and FIGS. 3A and 3B, the separation layer 139 includes the leg portion 139a and the stage portion 139b.

In the structure illustrated in FIG. 2B and FIGS. 3A and 3B, the leg portion 139a and the stage portion 139b of the separation layer 139 are formed of different materials. However, the separation layer 139 may be formed of one material.

⟨Material⟩

The wiring 133a and the wiring 133b are formed using a material selected from copper (Cu), titanium (Ti), tantalum (Ta), tungsten (W), molybdenum (Mo), chromium (Cr), neodymium (Nd), scandium (Sc), or nickel (Ni), or an alloy material containing any of these materials as its main component. Note that in this embodiment, the wiring 133a and the wiring 133b each have a stacked-layer structure; however, they may each have a single layer structure. In this embodiment, the wiring 133a is formed using a titanium film, and the wiring 133b is formed using a copper film. Copper can be preferably used because of its low resistance. The thickness of the wirings is preferably greater than or equal to 2 μm and less than or equal to 35 μm.

The planarization layer 134 can be fanned using an inorganic insulating material or an organic insulating material. Note that the planarization layer 134 formed using a heat-resistant organic insulating material such as an acrylic resin, a polyimide, a benzocyclobutene-based resin, a polyamide, or an epoxy resin is preferably used as a planarization insulating film. Other than such organic insulating materials, it is possible to use a low-dielectric constant material (a low-k material), a siloxane based resin, phosphosilicate glass (PSG), borophosphosilicate glass (BPSG), or the like. Note that the planarization layer 134 may be formed by stacking a plurality of insulating films formed using any of these materials.

A method for forming the planarization layer 134 is not particularly limited, and a sputtering method, a spin coat method, a dipping method, a printing method, an inkjet method, or the like can be used depending on the material.

The first electrode 211, the first electrode 103a, the first electrode 103b, and the first electrode 103c are provided on the side opposite to the light extraction side and are formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

As a material of the partition wall 107, for example, an organic resin such as polyimide, acrylic, polyamide, or epoxy or an inorganic insulating material can be used.

The angle of a side wall surface of a layer whose end portion with a forward tapered shape is in contact with a layer to be a base is greater than or equal to 10° and less than or equal to 85°, preferably greater than or equal to 60° and less than or equal to 80°.

It is particularly preferable that the partition wall 107 be formed using a photosensitive resin material to have an opening over each of the first electrode 103a, the first electrode 103b, and the first electrode 103c so that a sidewall of the opening has an inclined surface with a continuous curvature. Specifically, the radius of curvature of a curve drawn by a cross section of an insulating film is desirably approximately 0.2 μm to 2 μm.

A method for forming the partition wall is not particularly limited, and a sputtering method, an evaporation method, a droplet discharging method (e.g., an inkjet method), a printing method (e.g., a screen printing method or an off-set printing method), or the like may be used.

The thickness of the partition wall may be, for example, greater than or equal to 20 nm and less than or equal to 200 nm, preferably greater than or equal to 50 nm and less than or equal to 100 nm.

The organic EL layers 212, 102a, 102b, and 102c each have at least a layer containing a light-emitting organic compound. In addition, the organic EL layers 212, 102a, 102b, and 102c can each have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of organic EL layers are provided between a first electrode and a second electrode can be used. A stacked-layer structure of two layers, three layers, or four layers (in particular, a stacked-layer structure of three layers) is preferably used. An example of a detailed structure of the organic EL layer will be described later.

As a light-transmitting material which can be used for the second electrodes 213, 108a, 108b, and 108c, indium oxide, indium oxide-tin oxide, indium oxide-zinc oxide, zinc oxide, zinc oxide to which gallium is added, graphene, or the like can be used.

The separation layer 139 can be formed using an inorganic insulating material or an organic insulating material. For example, a negative type photosensitive resin material can be used.

⟨Detailed Description of Organic EL Layer⟩

Figure 4A:
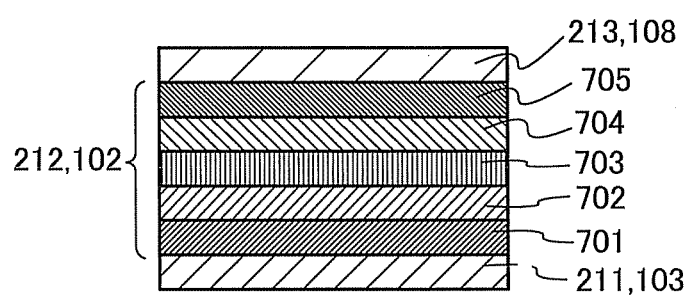
FIGS. 4A and 4B are cross-sectional views each illustrating the lighting device.

A detailed structure of the organic EL layer 212 and the organic EL layer 102 will be described with reference to FIGS. 4A and 4B.

In the organic EL layer 212, an electron-injection layer 701, an electron-transport layer 702, a layer 703 containing a light-emitting organic compound, a hole-transport layer 704, and a hole-injection layer 705 are stacked between the first electrode 211 and the second electrode 213 from the first electrode 211 side in this order.

In the organic EL layer 102 (the organic EL layer 102a, the organic EL layer 102b, and the organic EL layer 102c), the electron-injection layer 701, the electron-transport layer 702, the layer 703 containing a light-emitting organic compound, the hole-transport layer 704, and the hole-injection layer 705 are stacked between the first electrode 103 (the first electrode 103a, the first electrode 103b, and the first electrode 103c) and the second electrode 108 (the second electrode 108a, the second electrode 108b, and the second electrode 108c) from the first electrode 103 side in this order.

The electron-injection layer 701 is a layer containing a substance having a high electron-injection property. For the electron-injection layer 701, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of substances for forming the electron-transport layer 702, which is to be described later, can also be used.

The electron-transport layer 702 is a layer containing a substance with a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. Note that the electron-transport layer 702 is not limited to a single layer, but two or more layers containing the aforementioned substances may be stacked.

For the layer 703 containing a light-emitting organic compound, a fluorescent compound which exhibits fluorescence or a phosphorescent compound which exhibits phosphorescence can be used.

Examples of the fluorescent materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of materials that emit red light include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the layer 703 containing a light-emitting organic compound will be given. Examples of the materials that emit blue light include bis[2-(4',6'-difluorophenyl)pyridinato-N,C$^{2'}$]iridium (III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. Examples of the materials that emit green light include tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,C$^{2'}$)iridium(III) acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include the following organometallic complexes: bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as a phosphorescent compound.

Note that the layer 703 containing a light-emitting organic compound may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to transfer energy efficiently to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Examples of the materials that emit green light include poly (p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], or the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The hole-transport layer 704 is a layer containing a substance with a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of greater than or equal to $10^{-6}$ cm$^2$/Vs. It is to be noted that a substance other than the above may be used as long as it has a higher hole transport property than an electron transport property. The layer containing a substance having a high hole transport property is not limited to a single layer, and may be a stack of two or more layers containing any of the above substances.

For the hole-transport layer 704, a carbazole derivative such as CBP, CzPA, or PCzPA or an anthracene derivative such as t-BuDNA, DNA, or DPAnth may be used.

For the hole-transport layer 704, a high molecular compound such as PVK, PVTPA, PTPDMA, or Poly-TPD can be used.

The hole-injection layer 705 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: H$_2$Pc), or copper(II) phthalocyanine (abbreviation: CuPc) can also be used.

Alternatively, the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 705, a composite material in which an acceptor substance is mixed with an organic compound having a high hole-transport property is preferably used. With the use of the composite material in which an acceptor substance is mixed with a substance having a high hole-transport property, excellent hole injection from the second electrode 108 can be obtained, which results in a reduction in the driving voltage of the light-emitting element. Such a composite material can be formed by co-evaporation of a substance having a high hole-transport property and a substance having an acceptor property. When the hole-injection layer 705 is formed using the composite material, holes are easily injected from the second electrode 108 into the organic EL layer 102.

As the organic compound for the composite material, various compounds such as an aromatic amine compound, carbazole derivatives, aromatic hydrocarbon, and a high molecular compound (such as oligomers, dendrimers, or polymers) can be used. The organic compound used for the composite material is preferably an organic compound having a high hole-transport property. Specifically, a substance having a hole mobility of $10^{-6}$ cm$^2$/Vs or higher is preferably used. It is to be noted that a substance other than the above may be used as long as it has a higher hole transport property than an electron transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, it is possible to use the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10- diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Furthermore, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

Note that the hole injection layer 705 may be formed using a composite material of the high molecular compound such as PVK, PVTPA, PTPDMA, or Poly-TPD, and the electron acceptor.

Note that the electron-injection layer 701, the electron-transport layer 702, the layer 703 containing a light-emitting organic compound, the hole-transport layer 704, and the hole-injection layer 705 which are described above can each be formed by a method such as an evaporation method (e.g., a vacuum evaporation method), an ink-jet method, or a coating method.

Figure 4B:
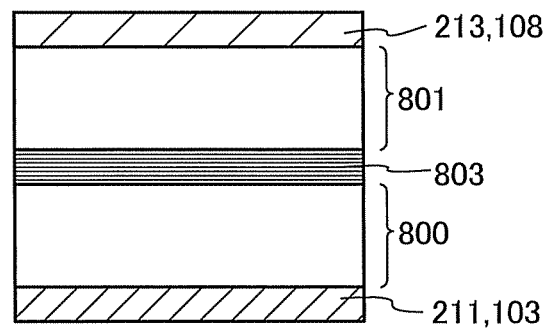

Note that a plurality of the organic EL layers 212 and a plurality of the organic EL layers 102 may be stacked between the first electrode 211 and the second electrode 213 and between the first electrode 103 and the second electrode 108, respectively, as illustrated in FIG. 4B. In that case, a charge generation layer 803 is preferably provided between a first organic EL layer 800 and a second organic EL layer 801 which are stacked. The charge generation layer 803 can be formed using the above-mentioned composite material. Further, the charge generation layer 803 may have a stacked structure including a layer containing the composite material and a layer containing another material. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the organic EL layers and fluorescence from the other of the EL layers can be readily obtained. This structure can be combined with the above-mentioned structures of the organic EL layer.

Further, by making the emission colors of the organic EL layers different from each other, light emission of a desired color can be obtained from the light-emitting element as a whole. For example, by forming a light-emitting element having two organic EL layers such that the emission color of the first organic EL layer and the emission color of the second organic EL layer are complementary colors, the light-emitting element can provide white light emission as a whole.

Note that "complementary colors" refer to colors that can produce an achromatic color when mixed. In other words, when lights obtained from substances which emit complementary colors are mixed, white emission can be obtained. Further, the same applies to a light-emitting element having three or more organic EL layers.

Thus, the organic EL layer 212 and the organic EL layer 102 of this embodiment can be manufactured.

⟨Method for Manufacturing Lighting Device⟩

A method for manufacturing the lighting device illustrated in FIG. 2B will be described with reference to FIGS. 5A to 5E.

Note that the third light-emitting element 13 is not illustrated in FIGS. 5A to 5E; however, the third light-emitting element 13 can be manufactured in a manner similar to those of the first light-emitting element 11 and the second light-emitting element 12.

First, a conductive film for forming the wiring is formed over the substrate 201. The conductive film can be formed with the use of a film formation method such as a sputtering method. Then, a known semiconductor processing technique is used to remove unnecessary portions of the conductive film, so that the wiring 133a and the wiring 133b (not illustrated) are formed.

Next, the planarization layer 134 covering the wiring 133a and the wiring 133b is formed. There is no particular limitation on the method for forming the planarization layer 134. The planarization layer 134 can be formed; depending on the material, by a method such as a sputtering method, an SOG method, a spin coating method, a dipping method, a spray coating method, a droplet discharging method (e.g., an inkjet method), a printing method (e.g., a screen printing method or an off-set printing method), or with a tool (equipment) such as a doctor knife, a roll coater, a curtain coater, or a knife coater. After that, openings reaching the wiring 133a and the wiring 133b are formed (not illustrated).

Next, a conductive film connecting to the wiring 133a and the wiring 133b through the openings is formed, and then the first electrode 103a, the first electrode 103b, and the extraction electrode (not illustrated) are formed with the use of a known semiconductor processing technique.

Figure 5A:
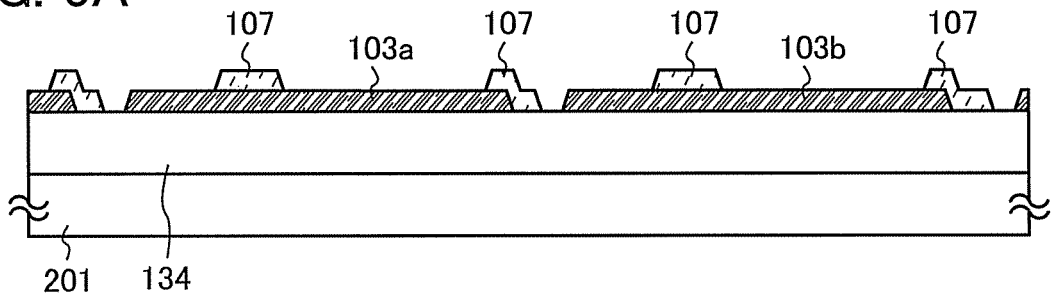
FIGS. 5A to 5E are cross-sectional views illustrating a method for manufacturing the lighting device.

After that, the partition walls 107 covering one of end portions of the first electrode 103a and one of end portions of the first electrode 103b, and the partition walls 107 over the first electrode 103a and the first electrode 103b are formed at the same time (see FIG. 5A).

Next, the separation layer 139 is formed over the first electrode 103a and the first electrode 103b.

The separation layer 139 includes the leg portion 139a and the stage portion 139b. Here, the leg portion 139a and the stage portion 139b are formed so that the area of part of the leg portion 139a, which is in contact with the first electrode 103, is smaller than a projected area of the stage portion 139b. This processing is preferably performed through one processing step.

Figure 5B:
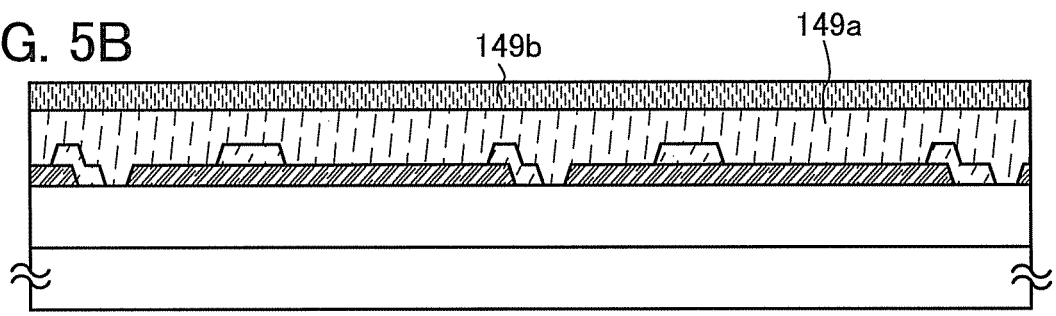
Figure 5C:
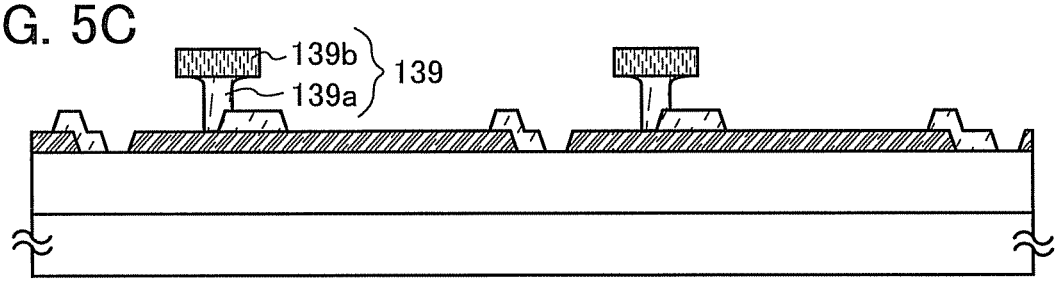

First, an insulating film 149a which is to be the leg portion later and an insulating film 149b which is to be the stage portion later are formed in this order (see FIG. 5B).

In this embodiment, a negative type photosensitive organic resin film is used for the insulating film 149a and the insulating film 149b. For the insulating film 149a, a material with a lower photosensitivity to light used for light exposure than that of the insulating film 149b is used. The difference in the photosensitivity means that the diameter of a pattern of the insulating film 149a with a low photosensitivity becomes smaller than that of the insulating film 149b when the insulating films 149a and 149b are irradiated with light with the same intensity.

After the insulating film 149a and the insulating film 149b are formed, the insulating films 149a and 149b are selectively irradiated with light. Then, development treatment is performed, so that the separation layer 139 including the leg portion 139a and the stage portion 139b is formed (see FIG. 5C). At this time, in the separation layer 139, because of the difference in the photosensitivity, an area in which the leg portion 139a is in contact with the first electrode 103 is smaller than the projected area of the stage portion 139b.

Note that exposure treatment may be performed two or more times. For example, exposure treatment may be performed twice with the use of two kinds of wavelength.

Figure 5D:
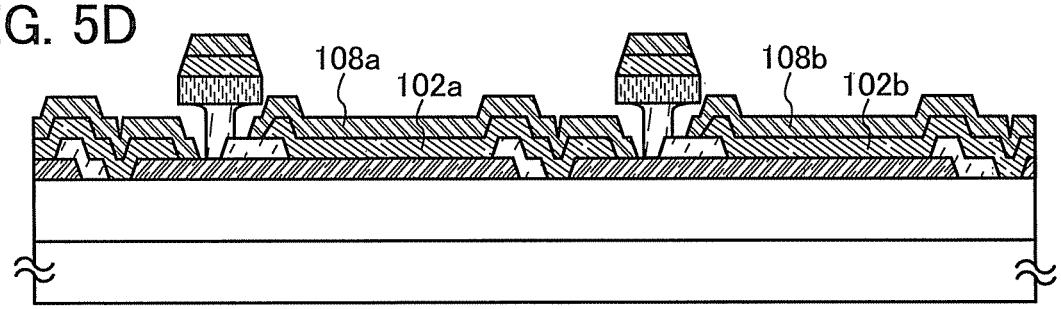

Next, the organic EL layer 102a, the organic EL layer 102b, the second electrode 108a, and the second electrode 108b are formed without using a metal mask (see FIG. 5D). At this time, part of the organic EL layer 102 (the organic EL layer 102a and the organic EL layer 102b) is physically divided by the separation layer 139 to be electrically separated. In addition, part of the second electrode 108 (the second electrode 108a and the second electrode 108b) is physically divided by the separation layer 139 to be electrically separated.

The second electrode 108 is formed directly under the stage portion 139b that is a protruded portion of the separation layer 139 and covers the organic EL layer 102 formed just before formation of the second electrode. When the second electrode 108 is formed in such a manner, an end portion of the second electrode 108 crosses over the organic EL layer 102 and in contact with the first electrode directly under the stage portion 139b; thus, the second electrode is electrically connected to the first electrode. Further, the other end portion of the second electrode is formed so as to be in contact with the partition wall 107 directly under the stage portion 139b.

As a film formation method of the organic EL layer 102, an evaporation method or the like can be used. As a film formation method of the second electrode 108, an evaporation method, a sputtering method, or the like can be used. As a sputtering method, besides a magnetron sputtering method, a mirrortron sputtering method is preferably used because the amount of the entry of the second electrode 108 can be increased.

In order to form the second electrode 108 so as to cover the organic EL layer 102 as described above, the distance between a deposition source and the substrate is set as appropriate. For example, when the distance between the deposition source and the substrate is large, a film formation in which the amount of the second electrode entering a region under the protruded portion of the stage portion 139b is small can be performed. On the other hand, when this distance is small, the amount of the second electrode entering the region under the protruded portion of the stage portion 139b can be increased. Therefore, when forming the organic EL layer 102, the distance between the deposition source and the substrate is made large so that the amount of the entry of the organic EL layer 102 is small. On the other hand, when forming the second electrode 108, the distance between the deposition source and the substrate is made small.

Further, in forming the second electrode 108, the substrate may be placed obliquely with respect to the deposition source and rotated. Thus, the second electrode 108 can be formed so as to enter the region under the protruded portion of the stage portion 139b.

In this manner, the first light-emitting element 11 and the second light-emitting element 12 which are connected in series can be formed over the substrate 201.

Figure 5E:
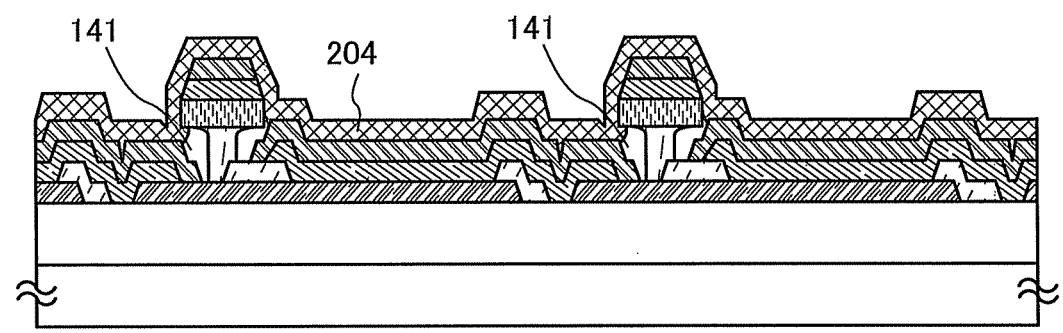

Subsequently, the first barrier layer 204 covering the whole components over the substrate 201 is formed (see FIG. 5E).

When the first barrier layer 204 is formed, a void is formed in a region directly under the protruded portion of the stage portion 139b of the separation layer 139 in some cases. However, even if a void is formed, since the first barrier layer 204 is formed so as to cover the whole components over the substrate 201, the void does not adversely affect reliability of the light-emitting elements.

Note that in this embodiment, a method using two kinds of organic resin films having different photosensitivities is described as the formation method for the separation layer 139; however, other formation methods can also be used.

For example, the insulating film 149a can be formed using an inorganic insulating film, and the insulating film 149b can be formed using a photosensitive organic film. First, exposure treatment, development treatment, and the like are performed and unnecessary portions of the insulating film 149b are removed; thus, the stage portion 139b is formed. Then, the stage portion 139b is used as a mask and the insulating film 149a is etched, so that the leg portion 139a is formed. At this time, conditions such as etching time or the like are adjusted as appropriate so that the projected area of the leg portion 139a, which is formed, is smaller than that of the stage portion 139b. For the etching of the insulating film 149a, a method which causes less damage to the exposed first electrode and the exposed partition wall 107 due to etching is preferably used.

Alternatively, the insulating film 149a and the insulating film 149b can be formed using a combination of inorganic materials with different etching rates. Typically, a combination of a silicon oxide film and a silicon nitride film is given; however, the combination is not limited to this, and a combination of films selected from an insulating film containing silicon or germanium; an organic insulating film; a metal oxide insulating film; and the like can be used as appropriate. First, a resist mask is formed over the insulating film 149b by a photolithography method, and the insulating film 149b is etched under a condition in which the etching rate of the insulating film 149a is low, so that the stage portion 139b is formed, and then the resist mask is removed. After that, the stage portion 139b is used as a mask, and the insulating film 149a is etched under a condition in which the etching rate of the film for forming the stage portion 139b is low; thus, the leg portion 139a is formed. The resist mask may be removed after the stage portion 139b is formed or after the leg portion 139a is formed, or the resist mask can be left without being removed. As for a method for etching, it is preferable to give consideration to damage to the underlying layer due to etching as described above.

As described above, the separation layer 139 can be formed by a various formation methods. Accordingly, due to such a difference in formation methods, the separation layer 139 can have a different shape from the shape of FIG. 2B and FIG. 5D.

Thus, according to this embodiment, entry of moisture or gas into the organic EL layer can be prevented, so that deterioration of the organic EL layer can be suppressed.

Further, according to this embodiment, deterioration of the organic EL layer is suppressed, whereby reliability of the lighting device including the organic EL layer can be improved.

Furthermore, in the lighting device in this embodiment, the light extraction efficiency is improved.

Embodiment 2

In this embodiment, an application example of the lighting device described in Embodiment 1 will be described with reference to FIGS. 6A and 6B.

Figure 6A:
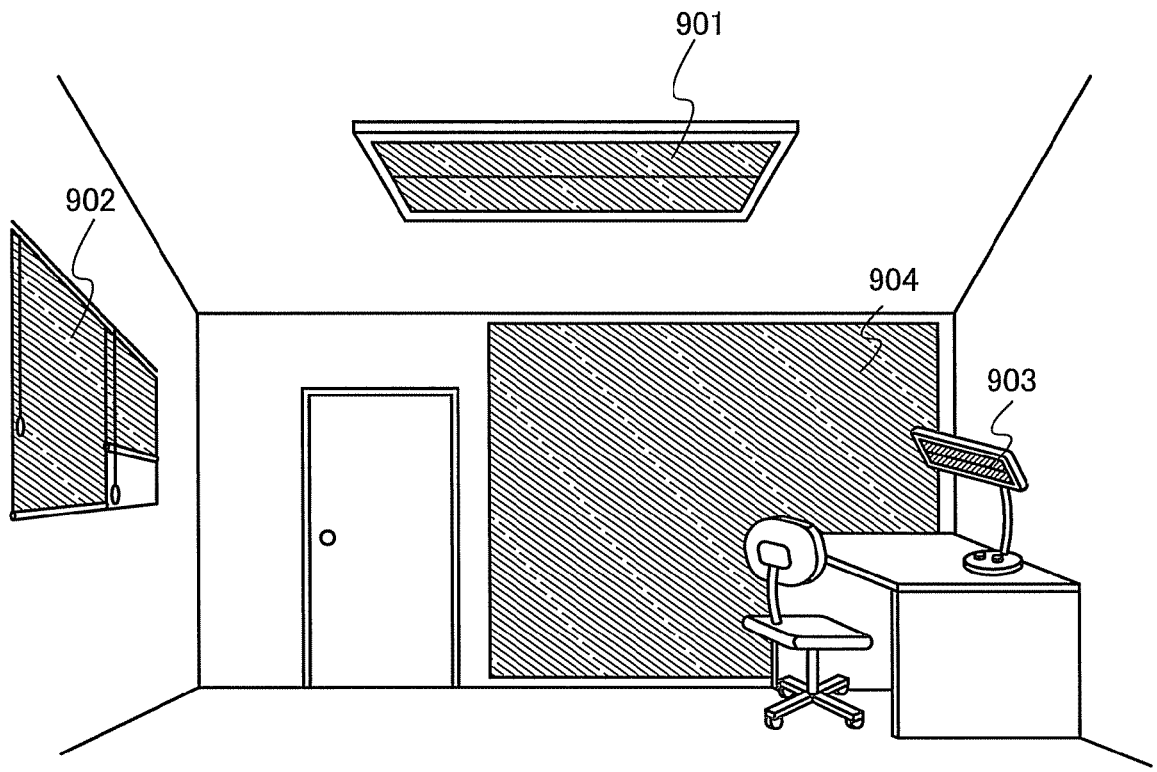
FIGS. 6A and 6B are views each illustrating an application example of the lighting device.

FIG. 6A illustrates an interior lighting device 901, an interior lighting device 904, and a desk lamp 903 to which one embodiment of the disclosed invention is applied. Since the lighting device according to one embodiment of the disclosed invention can have a large area, the lighting device can be used as a lighting device having a large area. In addition, the lighting device can be used as a roll-type lighting device 902.

Figure 6B:
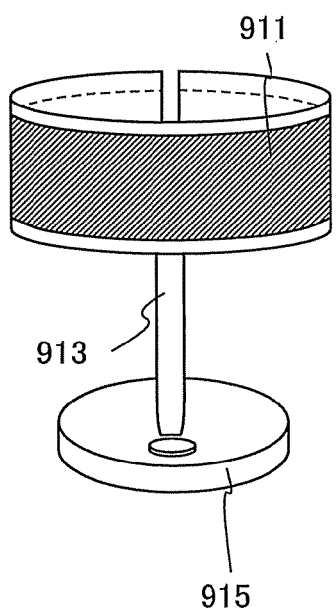

FIG. 6B illustrates an example of another lighting device. A desk lamp illustrated in FIG. 6B includes a lighting portion 911, a support 913, a support base 915, and the like. The lighting portion 911 includes the lighting device described in Embodiment 1. As described above, in one embodiment of the present invention, a lighting device having a curved surface or a lighting device having a flexible lighting portion can be provided. In this manner, the use of a flexible lighting device not only improves the degree of freedom in design of the lighting device but also enables the lighting device to be mounted onto a portion having a curved surface, such as a ceiling or a dashboard of a car.

This embodiment can be freely combined with another embodiment.

This application is based on Japanese Patent Application serial no. 2011-028237 filed with the Japan Patent Office on Feb. 14, 2011, the entire contents of which are hereby incorporated by reference.

What is claimed is:

1. A lighting device comprising:
   a light-emitting element layer over a substrate;
   a first barrier layer over the light-emitting element layer;
   a second barrier layer over the first barrier layer;
   a resin layer including a desiccant, the resin layer being surrounded by the first barrier layer, and the second barrier layer; and
   a resin substrate over the second barrier layer,
   wherein the resin substrate has a first surface and a second surface which is on an opposite side of the first surface, the first surface being in contact with at least part of the second barrier layer;
   wherein at least part of the first surface has a first uneven structure, and at least part of the second surface has a second uneven structure; and
   wherein a height difference of the second uneven structure is larger than a height difference of the first uneven structure.

2. The lighting device according to claim 1,
   wherein the first barrier layer comprises a material selected from the group consisting of aluminum oxide, silicon nitride, and silicon oxynitride; and
   wherein the second barrier layer comprises a material selected from the group consisting of aluminum oxide, silicon nitride, and silicon oxynitride.

3. The lighting device according to claim 1, wherein the height difference of the first uneven structure is greater than or equal to 0.5 µm and less than or equal to 50 µm, and a height difference of the second uneven structure is greater than or equal to 100 µm and less than or equal to 5 mm.

4. The lighting device according to claim 1,
   wherein the first uneven structure is formed in a stripe shape or in a matrix shape; and
   wherein the second uneven structure is formed in a stripe shape or in a matrix shape.

5. The lighting device according to claim 1,
   wherein a cross-sectional shape of the first uneven structure is a hemisphere shape or a shape with a vertex; and
   wherein a cross-sectional shape of the second uneven structure is a hemisphere shape or a shape with a vertex.

6. The lighting device according to claim 1, wherein the substrate is a stainless steel substrate, a tungsten substrate, a nickel substrate, an aluminum substrate, a glass substrate, or a ceramic substrate.

7. The lighting device according to claim 1, wherein a base film is formed between the substrate and the light-emitting element layer.

8. The lighting device according to claim 7, wherein the base film comprises a material selected from the group consisting of aluminum oxide, silicon nitride, and silicon oxynitride.

9. The lighting device according to claim 1, wherein a refractive index of the light-emitting element layer, the first barrier layer, the second barrier layer and the resin layer is greater than or equal to 1.65 and less than or equal to 2.3.

10. The lighting device according to claim 1, wherein a refractive index of the resin substrate is greater than or equal to 1.5 and less than or equal to 1.6.

11. A lighting device comprising:
    a light-emitting element layer over a substrate;
    a first barrier layer over the light-emitting element layer;
    a second barrier layer over the first barrier layer;
    a resin layer including a desiccant, the resin layer being surrounded by the first barrier layer, and the second barrier layer; and
    a resin substrate over the second barrier layer;
    wherein the resin substrate has a first surface and a second surface which is on an opposite side of the first surface, the first surface being in contact with at least part of the second barrier layer;
    wherein at least part of the first surface has a first uneven structure, and at least part of the second surface has a second uneven structure;
    wherein the second barrier layer has a third surface and a fourth surface which is on an opposite side of the third surface, the third surface being in contact with at least part of the resin substrate, the fourth surface being in contact with at least part of the resin layer;
    wherein at least part of the third surface has a third uneven structure, and at least part of the fourth surface has a fourth uneven structure; and
    wherein a height difference of the second uneven structure is larger than a height difference of the first uneven structure.

12. The lighting device according to claim 11,
    wherein the first barrier layer comprises a material selected from the group consisting of aluminum oxide, silicon nitride, and silicon oxynitride; and
    wherein the second barrier layer comprises a material selected from the group consisting of aluminum oxide, silicon nitride, and silicon oxynitride.

13. The lighting device according to claim 11, wherein the height difference of the first uneven structure is greater than or equal to 0.5 µm and less than or equal to 50 µm, and a height difference of the second uneven structure is greater than or equal to 100 µm and less than or equal to 5 mm.

14. The lighting device according to claim 11,
    wherein the first uneven structure is formed in a stripe shape or in a matrix shape; and wherein the second uneven structure is formed in a stripe shape or in a matrix shape.

15. The lighting device according to claim 11,
wherein a cross-sectional shape of the first uneven structure is a hemisphere shape or a shape with a vertex; and
wherein a cross-sectional shape of the second uneven structure is a hemisphere shape or a shape with a vertex.

16. The lighting device according to claim 11, wherein the substrate is a stainless steel substrate, a tungsten substrate, a nickel substrate, an aluminum substrate, a glass substrate, or a ceramic substrate.

17. The lighting device according to claim 11, wherein a base film is formed between the substrate and the light-emitting element layer.

18. The lighting device according to claim 17, wherein the base film comprises a material selected from the group consisting of aluminum oxide, silicon nitride, and silicon oxynitride.

19. The lighting device according to claim 11, wherein a refractive index of light-emitting element layer, the first barrier layer, the second barrier layer and the resin layer is greater than or equal to 1.65 and less than or equal to 2.3.

20. The lighting device according to claim 11, wherein a refractive index of the resin substrate is greater than or equal to 1.5 and less than or equal to 1.6.

* * * * *

UNITED STATES PATENT AND TRADEMARK OFFICE
CERTIFICATE OF CORRECTION

PATENT NO.      : 8,593,059 B2  
APPLICATION NO. : 13/371779  
DATED           : November 26, 2013  
INVENTOR(S)     : Koichiro Tanaka and Yusuke Nishido Page 1 of 1

It is certified that error appears in the above-identified patent and that said Letters Patent is hereby corrected as shown below:

In the Specification:

Column 4, line 56; Change "fainted" to --formed--.
Column 7, line 26; Change "faulted" to --formed--.
Column 9, line 9; Change "framed" to --formed--.
Column 10, line 30; Change "fanned" to --formed--.
Column 13, line 55; Change "(2-thenyl)" to --(2-thenoyl)--.
Column 18, line 28; Change "formed; depending" to --formed, depending--.

In the Claims:

Column 23, line 20, Claim 19; Change "index of light-emitting" to --index of the light-emitting--.

Signed and Sealed this
Eleventh Day of March, 2014

Michelle K. Lee
*Deputy Director of the United States Patent and Trademark Office*